United States Patent
Fujii

[19]
[11] Patent Number: 5,883,812
[45] Date of Patent: Mar. 16, 1999

[54] INTERCONNECTION ROUTING METHOD FOR REDUCING CROSSTALK BETWEEN INTERCONNECTIONS

[75] Inventor: Takashi Fujii, Tokyo, Japan

[73] Assignee: NEC Corporation, Tokyo, Japan

[21] Appl. No.: 534,806

[22] Filed: Sep. 27, 1995

[30] Foreign Application Priority Data

Sep. 30, 1994 [JP] Japan .................................. 6-236546

[51] Int. Cl.$^6$ .................................................. G06F 17/50
[52] U.S. Cl. ........................................... 364/490; 364/489
[58] Field of Search .................................. 364/488, 489, 364/490, 491

[56] References Cited

U.S. PATENT DOCUMENTS

| | | | |
|---|---|---|---|
| 3,644,937 | 2/1972 | Isett ............................................. | 444/1 |
| 4,613,941 | 9/1986 | Smith et al. ............................... | 364/490 |
| 4,852,016 | 7/1989 | McGehee .................................. | 364/491 |
| 4,903,214 | 2/1990 | Hiwatashi ................................. | 364/491 |
| 4,910,680 | 3/1990 | Hiwatashi ................................. | 364/491 |
| 5,272,645 | 12/1993 | Kawakami et al. ...................... | 364/491 |
| 5,295,082 | 3/1994 | Chang et al. ............................. | 364/490 |

OTHER PUBLICATIONS

"A Spacing Algorithm for Performance Enhancement and Cross-talk Reduction"; Kamal Chaudhary et al.; IEEE 1993; pp. 697–702.

"Minimum Crosstalk Channel Routing"; Tong Gao and C.L. Liu; University of Illinois; Department of Computer Science; 1993 IEEE; pp. 692–696.

"Wiring and Crosstalk Avoidance in Multi–Chip Module Design"; Howard H. Chen and C.K. Wong; IBM Research Division; Thomas J. Watson Research Center; 1992 IEEE Custom Integrated Circuits Conference; pp. 28.6.1–28.6.4.

*Primary Examiner*—Kevin J. Teska
*Assistant Examiner*—Leigh Marie Garbowski
*Attorney, Agent, or Firm*—Whitham, Curtis, Whitham & McGinn

[57] ABSTRACT

An interconnection routing method for an intergrated circuit is applied to a channel area. The method includes the steps of calculating the length of each net in a given routing to thereby obtain a first set of nets having a long trunk. The nets in the first set are assigned to tracks in a central portion of the channel area to reduce crossings between the long trunk nets and other nets. The method further includes forming a second set for net pairs each running parallel in a long length with a small space therebetween. One of the net pairs in the second set is divided or doglegged to obtain a reduced coupled capacitance and crosstalk between the pairs. The present invention reduces crosstalk and coupled capacitance induced between parallel running interconnections or crossing interconnections.

10 Claims, 8 Drawing Sheets

INTERCONNECTION ROUTING METHOD FOR REDUCING CROSSTALK BETWEEN INTERCONNECTIONS

BACKGROUND OF THE INVENTION (a) Field of the Invention

The present invention relates to an interconnection routing method for an integrated circuit, and more particularly, to an interconnection routing method for a high performance integrated circuit, by reducing electric interaction induced between the interconnections which has an influence on circuit performance, such as increase of crosstalk or coupled capacitance between the interconnections.

(b) Description of the Related Art

A conventional interconnection routing method for an integrated circuit generally involves manual modification (first method), after an optimized and detailed interconnection design is completed by a channel routing, in order to reduce the number of crossings between the interconnections.

Two other methods are further used, in addition to the first method as described above, in order to limit lengths of adjacent and parallel running interconnections. One is employed to increase the spacing between the interconnections using a compactor (second method) and the other is employed to permutate the tracks for the interconnections in a channel area (third method).

For example, those conventional methods are described in a document entitled "Minimum Crosstalk Channel Routing", IEEE ICCAD' 1993, Tong, Gao et al. p692–696.

The first method for the manual modification is carried out based on information for coupled capacitance and crosstalk obtained from the result of detailed interconnection routing given by the previous processing.

In detail, the modification is carried out by a partial permutation of the resultant nets of interconnections involving a layout problem. The modifications may include rip-up and reroute of target nets, or moving some of the resultant nets to enlarge the spacing therebetween.

Referring to FIGS. 1A and 1B, crosstalk induced between net a and net e is reduced in FIG. 1B by permutating the track for the net e, for a given detailed interconnection routing shown in FIG. 1A. Alternatively, as shown in FIG. 1C, the modification is carried out so as to reduce the crosstalk by inserting an empty track between the nets a and net e which are likely to cause a crosstalk problem, thereby enlarging the spacing therebetween.

The second method using the compactor is such that the process for enlarging the spacing between the nets in the manual modification as described above is carried out by an automated compaction process. In general, the compaction process is carried out in the procedure shown in FIG. 2 by a compactor.

In FIG. 2, the compaction process includes the steps S101 through S103. Step S101 involves extraction of information as to crosstalk in which a set P for net pairs (net n and net n') inducing crosstalk therebetween is extracted from a given interconnection routing such as shown in FIG. 1A. Step S102 involves constraint introduction as to spacing between the pair in which a constraint is introduced such that the spacing between the pair, e.g., net n and net n' is equal to or larger than a threshold, or a target spacing. Step S103 involves compaction processing in which the space between respective net pairs included in the set P is enlarged, in addition to a design rule not to violate vertical constraints.

FIG. 1C shows the resultant interconnection routing obtained by the compaction process applied to the given interconnection routing shown in FIG. 1A.

In FIG. 1C, in a central portion of the channel area, the empty track is inserted between the tracks for net a and net e running adjacent and parallel to each other. The crosstalk induced between net a and net e is reduced accordingly.

The third method, in which adjacent nets inducing crosstalk therebetween are moved away from each other by permutating tracks assigned to whole interconnections using a known track assignment process, includes three steps as described below. FIG. 3 shows the process flow thereof.

In FIG. 3, step S201 involves extraction of adjacent nets in which a set R(n) of nets adjacent to a net n is formed from a given interconnection routing.

Step S202 involves calculation by a detailed function CT(n,m) for crosstalk, in which calculation by the crosstalk function CT(n,m) is executed based on the length l(n,m) of the path along which net n and net m run adjacent and parallel to each other and on the distance d(n,m) between the net n and net m, for the net m belonging to the set R(n) and running adjacent and parallel to a specified net n. For example, the crosstalk function CT(n,m) is represented by k·l(n,m)/d(n,m), wherein k is a constant.

Last step S203 involves permutation of tracks, in which the track number for each net is determined by calculation using a linear programming method so as to minimize the maximum value of the evaluation function CT for all the net pairs existing in the channel area.

By applying the third method to the given interconnection routing shown in FIG. 1A, the crosstalk is reduced through permutation of track 1 with track 2 to enlarge the spacing between the trunks of the net a and net e. The resultant routing is shown in FIG. 1D.

As described above, the conventional methods for the interconnection routing in the integrated circuit are employed to reduce electric interactions induced between the interconnections and causing increase of the coupled capacitance and the crosstalk, by limiting the lengths of adjacent and parallel running interconnections.

Reduction of the number of the crossings in an integrated circuit and limitation on the lengths of the adjacent and parallel running interconnections are important in order to avoid reduction in operation speed due to increase of the coupled capacitance or signal errors due to crosstalk. However, in the conventional methods, there are problems, such as errors in manual modification and increase in amount of processing time associated with after-treatment, resulting from repetitive practices directed to optimization after the compaction process.

Further, it is difficult to insure an optimal design for a final interconnection routing because of after-treatment executed for the optimized and given interconnection routing. There is also a problem that it is difficult to obtain an acceptable solution because of the vertical constraints.

SUMMARY OF THE INVENTION

It is therefore an object of the present invention to provide a method for an interconnection routing in an integrated circuit in which the amount of time required for processing of the interconnection routing is reduced and which does not violate design rules such as vertical constraints.

According to a first aspect of the present invention, there is provided an inteconnection routing method for obtaining an interconnection routing in a channel area of an integrated circuit including the steps of: forming a first set of nets each included in a given net list and having a trunk length larger than a first target length; assigning each of the nets included in the first set to a central track located in a central portion of the channel area; and assigning each of the nets not included in the first set to a peripheral track located in a peripheral portion of the channel area.

According to a second aspect of the present invention, there is provided an interconnection routing method for obtaining an interconnection routing in a channel area of an integrated circuit including the steps of: assiging each net in a given net list to a track in a channel area to obtain a virtual routing; forming a second set of net pairs included in the given net list, the net pairs each having trunks running parallel in a length larger than a target length, with a space therebetween being smaller than a target distance, in the virtual routing; dividing the trunk of at least one net of each net pair included in the second set at a constant pitch to obtain subnets from the at least one net; replacing the at least one net in the given net list by the subnets to obtain a first net list; and assigining each net in the first net list to a track in the channel area to obtain a final routing.

According to a third aspect of the present invention, there is provided an interconnection routing method for obtaining an interconnection routing in a channel area of an integrated circuit including the steps of: assiging each net in a given net list to a track in a channel area to obtain a virtual routing; forming a first set of net pairs included in the given net list, the net pairs each having trunks running parallel in a length larger than a target length, with a space therebetween being smaller than a target distance, in the virtual routing; forming a jog in the trunk of at least one net of each net pair included in the first set such that the length of the trunks running parallel to each other, with a space therebetween being smaller than a target distance, is less than a target length to obtain a dogleg net; replacing the at least one net in the given net list by the dogleg net to obtain a first net list; and assiging each net in the first net list to a track to obtain a final routing.

In accordance with the first aspect of the present invention, number of crossings are reduced so that crosstalk or coupled capacitance between the crossing interconnections are reduced to obtain a high performance integrated circuit.

In accordance with the second and third aspect of the present invention, coupled capacitance or crosstalk induced between adjacent and parallel running interconnections is reduced to obtain a high performance integrated circuit.

The above and further objects as well as features and advantages of the present invention will be apparent from the following description of the preferred embodiments thereof as illustrated in the accompanying drawings.

DESCRIPTION OF THE PREFERRED EMBODIMENTS

The present invention will be now described with reference to the drawings.

Figure 4:
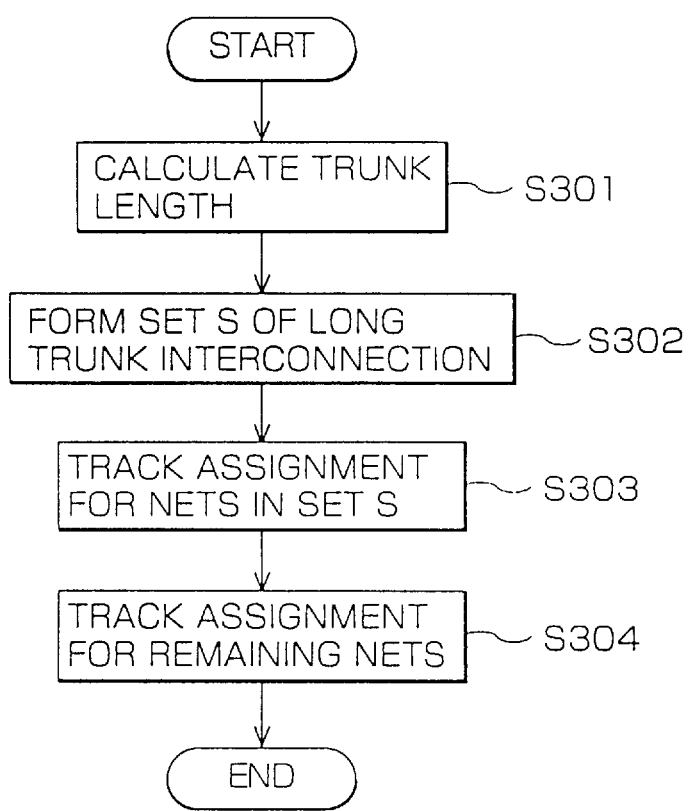
FIG. 4 is a flowchart showing a process in an interconnection routing method in an integrated circuit according to a first embodiment of the present invention.

Referring to FIG. 4 showing a process flow of an interconnection routing method for an integrated circuit according to a first embodiment of the present invention, the process includes four steps S301 through S304. The process is applied to interconnections including a net having a long trunk extending along almost a whole channel area. That is, terminals of the net are located near the both ends of the subject channel area. The process includes track assignment for minimizing the number of other nets crossing the target net in the channel area.

First step S301 in the present embodiment involves calculating the length of the trunk of each net.

It is assumed that in each net n, the leftmost terminal in the net n in the channel area and the co-ordinate thereof are represented by left(n) and XL(n), respectively, and that the rightmost terminal and the co-ordinate thereof are represented by right(n) and XR(n), respectively. For each net n in a given net list NL and coordinates XL and XR thereof are determined from the positions of the terminals. The value of |XR(n)−XL(n)| is referred to as the length LT(n) of the trunk for the net n.

Next step S302 involves obtaining a first set S of the nets each having a trunk length LT larger than or equal to $\alpha$. Here, the threshold or target length α is a positive constant given in advance by the designer.

Third step S303 involves assigning a track for each of the nets included in the set S, the track being located in a central portion of the channel area. The "central portion in the channel area" as used here is meant by, for example, a channel portion including the center of the channel area and occupying ¼ to ⅓ of the width of the channel area.

Fourth step S304 involves assigning a track to each of the remaining nets wherein the trunk for each of the remaining nets included in the set NL-S is assigned to a track in an upper portion or a lower portion of the channel area thereby avoiding the precedent nets assigned in step S303, based on the vertical constraints of the design rule.

An example of the interconnection routing as obtained according to the first embodiment in an integrated circuit will be described below.

Figure 5A:
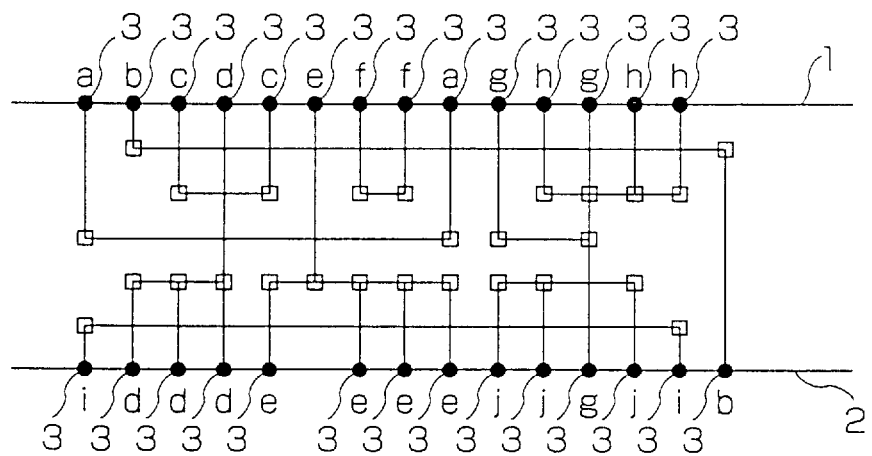
FIG. 5A is a diagram of an interconnection routing obtained without consideration of number of crossings by a conventional interconnection routing method for an integrated circuit.

FIG. 5A shows a result obtained by assigning tracks without considering the number of crossings between a trunk and other interconnections using a conventional method. A net b having a long trunk crosses other nets at as high as twelve points. Also, a net i crosses other interconnections at as high as eleven points.

Figure 5B:
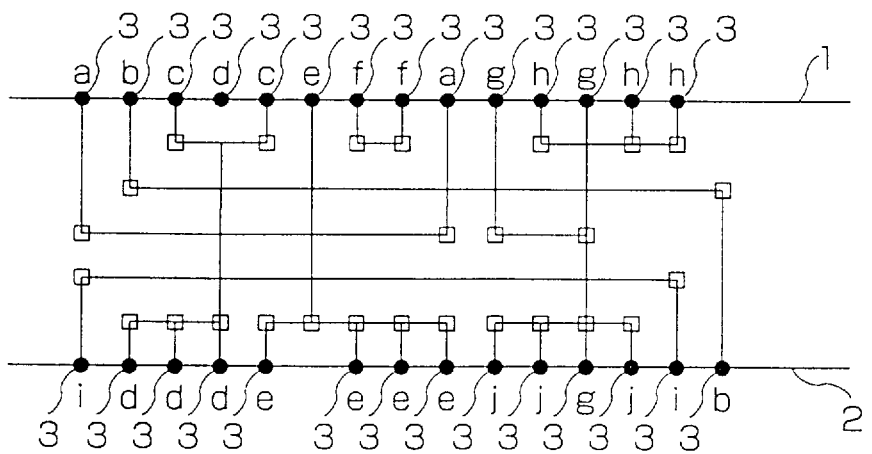
FIG. 5B is a diagram of an interconnection routing obtained from the routing of FIG. 5A by an interconnection routing method for the integrated circuit according to the first embodiment of the present invention.

FIG. 5B shows the result obtained by the present embodiment considering reduction in the number of the crossings. In FIG. 5B, the numbers of the points where the net b and net i cross other interconnections are five and three, respectively, according to the embodiment. That is, the number of the crossing points of the net b is reduced by 58% as compared to the result shown in FIG. 5A, while the number of the crossings of the net i is reduced by 54%. The threshold or target length a as used in step 302 of the embodiment may be specified automatically based on the path route through which the target nets pass and on a timing constraint.

Figure 6:
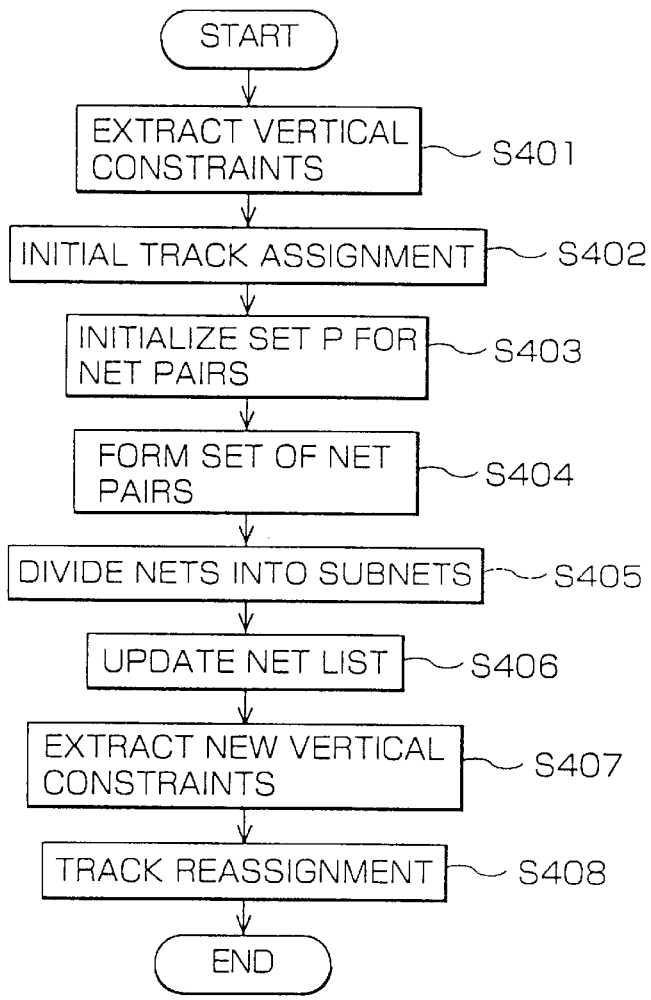
FIG. 6 is a flowchart showing a process in an interconnection routing method for an integrated circuit according to a second embodiment of the present invention.

FIG. 6 shows a process flow in an interconnection routing method for an integrated circuit according to a second embodiment of the present invention.

The interconnection routing method of the present embodiment has a step of assigning tracks after dividing trunks of respective nets in advance, thereby limiting total lengths of the trunks running adjacent and parallel to each other. The method includes eight steps S401 through S408 as detailed below.

First step S401 involves extracting vertical constraints R from a net list NL and terminal positions of each of the nets at the boundaries 1 and 2 of the channel area.

Next step S402 involves initial assignment to each of the nets included in the net list NL based on the vertical constraints R extracted in step S401 to obtain a virtual interconnection routing.

Next step S403 involves initializing a set P for net pairs to null or empty.

Next step S404 involves forming the set P for net pairs by entry of each net pair (n,n') in the virtual routing which satisfies the first and second conditions as described below.

The first condition is $|t(n)-t(n')| \leq \beta$, wherein $t(n)$ and $t(n')$ are track numbers for the trunk of nets n and n', respectively, specified in the initial track assignment.

The second condition is such that the length of a portion of the channel area in which the trunks of the nets n and N' run parallel is equal to or longer than γ. Here, β and γ are positive constants, and are threshold values given in advance by the designer.

Next step S405 involves division or cutting of each net pair included in the set P. Before division in this step, positions at the left end and the right end of the nets n and n' of the channel portion wherein the trunks of both the nets run parallel to each other are determined as xL(p) and xR(p), respectively, for each net pair p=(n,n') included in the set P.

The division process CUT1 is such that the net n is divided at positions xL(p)+γ, xL(p)+2γ, ..., and xL(p)+k·γ, from the left end xL(p) after the net n and the positions xL(p) and xR(p) are given.

Here, k is the maximum integer equal to or less than $|xL(p)-xR(p)|γ$. A subset C(n) is obtained after the process CUT1 in step S405 for the net n. Each of the elements of the subset C(n) is referred to as a subnet for the net n.

Next step S406 involves replacement of net n included in the net list NL and in the set P by the subnet included in the subset C(n) so as to update the net list NL.

Next step S407 involves introduction of spacing constraints V between an element of the subnet n and corresponding element of the subnet n' in the set P.

The spacing constraint V is such that, if there is a channel portion in which a subnet s in the C(n) and a subnet s' in C(n') run parallel to each other, the spacing between the tracks to which the trunks of the subnets s and s' are assigned is enlarged to be equal to or larger than β.

Final step S408 involves a second or final track assignment in which tracks are assigned based on the constraints RV including both vertical constraints R as obtained in step S401 and the spacing constraints V as obtained in step S407.

Figure 1A:
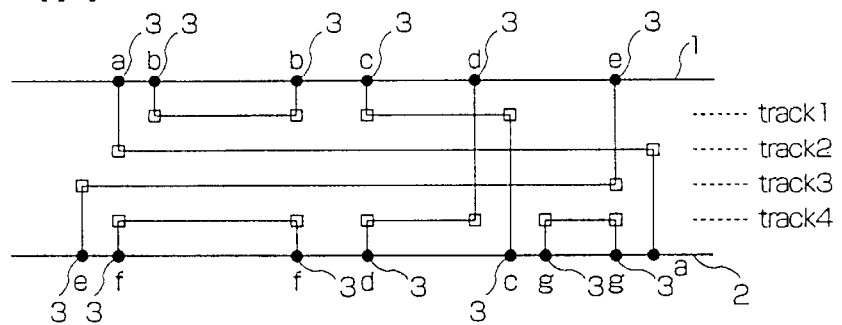
FIG. 1A is a diagram of a given interconnection routing in a channel area obtained without consideration of number of crossings by a conventional method.
Figure 1B:
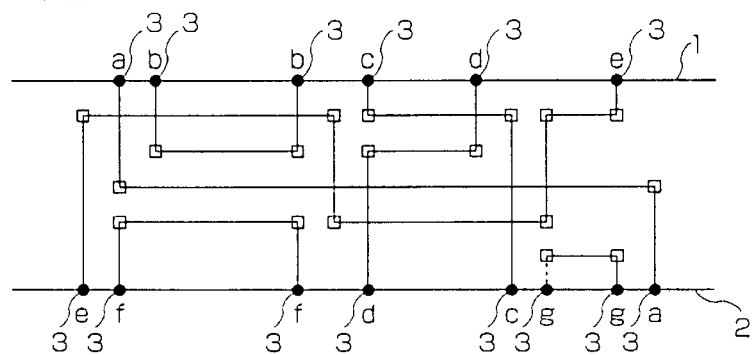
FIG. 1B is a diagram of an interconnection routing obtained by a conventional method for manual modification from the routing of FIG. 1A.
Figure 1C:
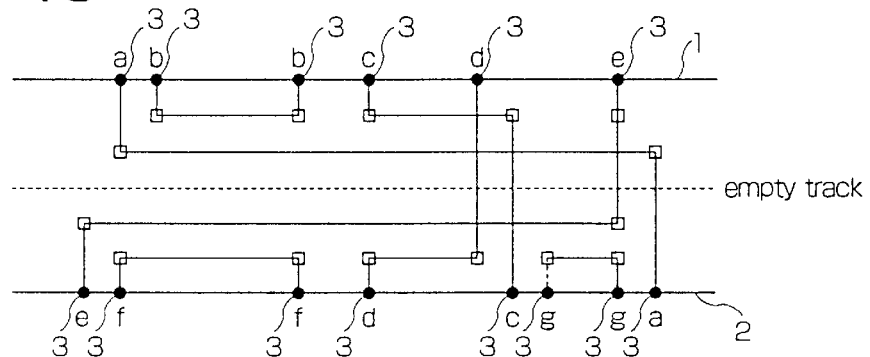
FIG. 1C is an interconnection routing obtained by a conventional method for manual modification or a compaction process from the routing of FIG. 1A.
Figure 1D:
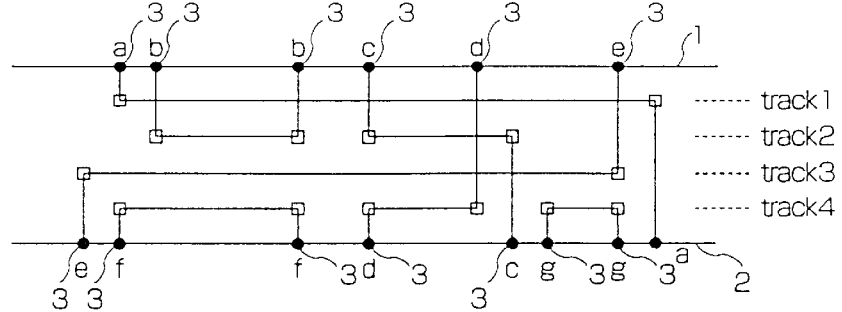
FIG. 1D is an interconnection routing obtained by a conventional method for track permutation from the routing of FIG. 1A.
Figure 2:
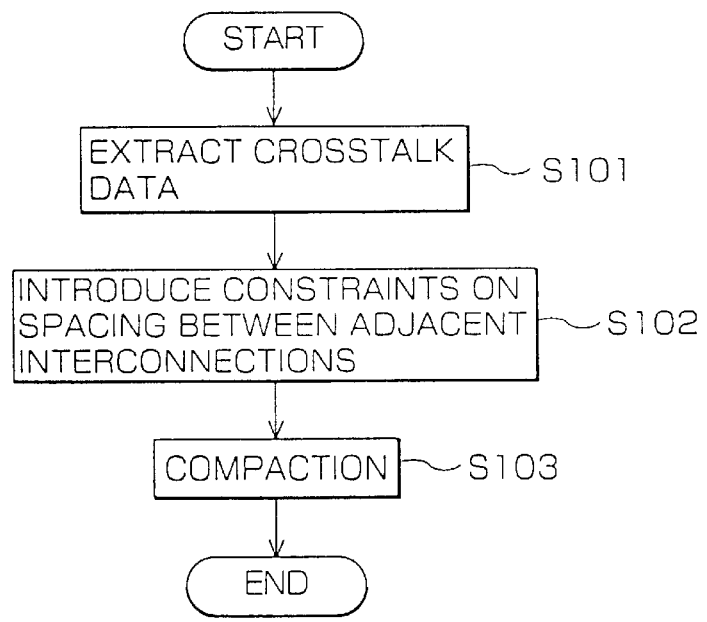
FIG. 2 is a flowchart showing a process by a compactor in a conventional interconnection routing method.
Figure 3:
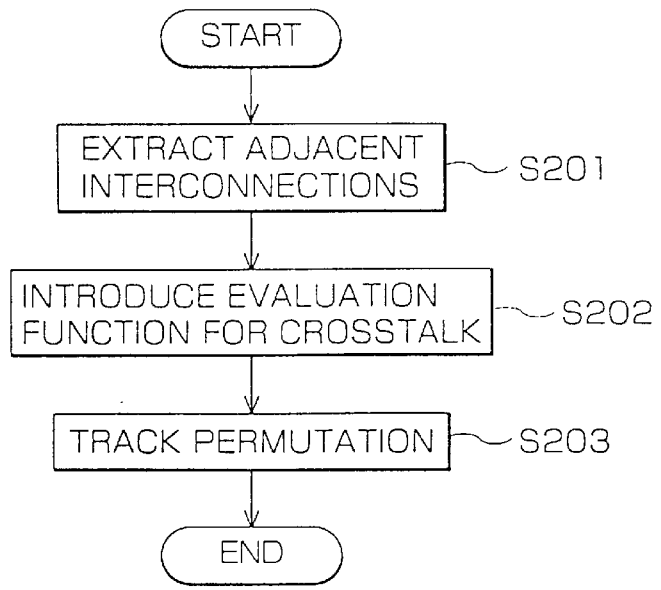
FIG. 3 is a flowchart showing a process for track permutation by a conventional routing interconnection method.
Figure 7:
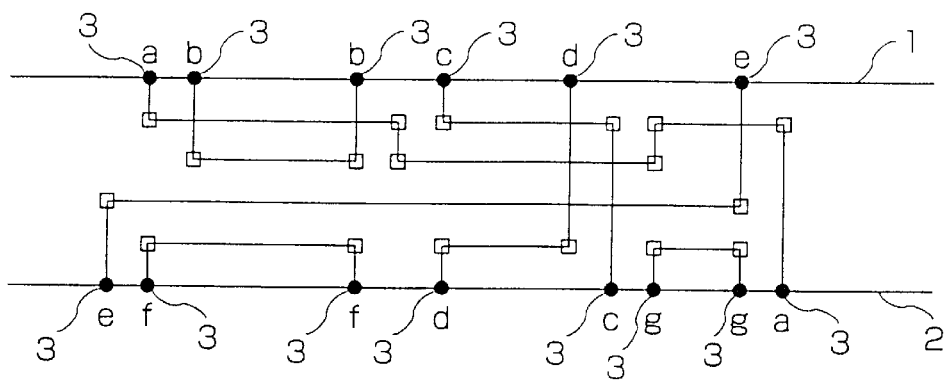
FIG. 7 is a diagram of an interconnection routing obtained by an interconnection routing method for an integrated circuit according to the second embodiment of the present invention.

FIG. 7 shows the resultant interconnection routing obtained by applying the present embodiment to a given interconnection routing shown in FIG. 1A. Here, β is selected at two, and γ is selected at six in the final routing.

In FIG. 7, the trunks of net a are divided at position numbers or columns 6 and 12 which are counted from the leftmost terminal of channel area. Accordingly, the length of the portion in which the trunks of net a and net e run parallel to each other is six.

It will be understood that the length is reduced by more than 43% as compared to the length of fourteen shown in FIG. 1A. Furthermore, the number of trunks used in the channel area is identical to that of FIG. 1A.

The thresholds β and γ as used in the present embodiment may be specified automatically based on the path route through which the target nets pass and/or on a timing constraint.

Figure 8:
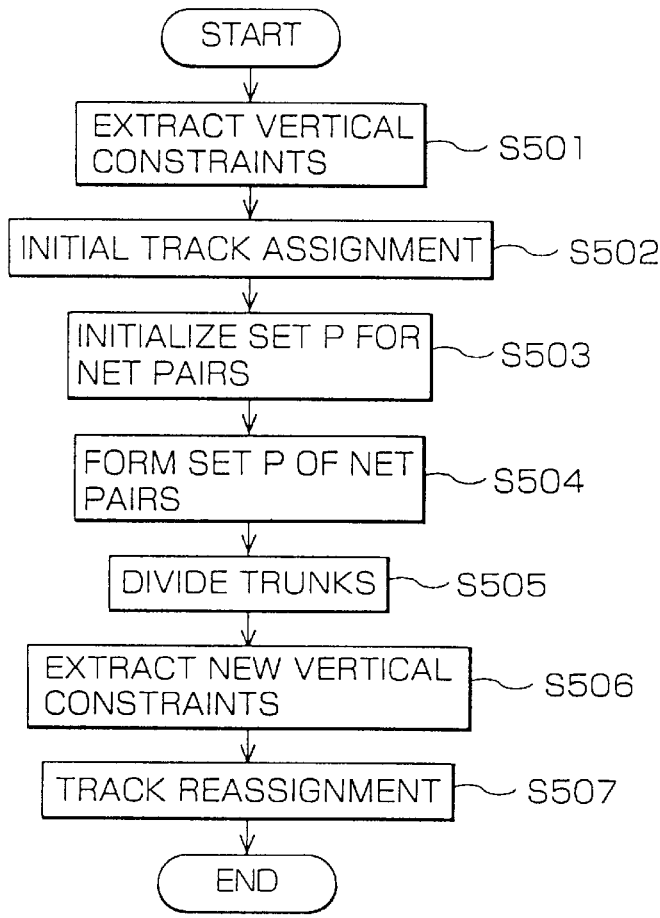
FIG. 8 is a flowchart showing a process in an interconnection routing method for an integrated circuit according to a third embodiment of the present invention.

FIG. 8 shows a process flow of an interconnection routing method for an integrated circuit according to a third embodiment of the present invention.

The interconnection routing method according to the present embodiment includes seven steps S501 through S507. In the embodiment, track constraints are introduced in which tracks must not be assigned consecutively to the nets which are listed consecutively to run parallel to each other in a channel area. The method includes a step of providing a jog in the net to obtain a dogleg running to satisfy both the vertical constraints and newly introduced constraints during a track assignment.

First step S501 involves extracting vertical constraints R from a net list NL and terminal positions of each of the nets in the net list NL.

Next step S502 involves an initial track assignment to each of the nets included in the net list NL based on the vertical constraints R extracted in step S501 to obtain a virual routing in the channel area.

Next step S503 involves initializing a set P for net pairs to null or empty, and subsequent step S504 involves forming the set P by entry of net pairs each satisfying a first and second conditions in the virtual routing as obtained in step S502 of track assignment.

The first condition is $|t(n)-t(n')| \leq \beta$ wherein $t(n)$ and $t(n')$ represent track numbers for net n and net n', respectively.

The second condition is such that the length of a channel portion in which the trunks of the net n and net n' run parallel to each other is equal to or larger than $\gamma$.

Subsequent step S505 involves division of nets of each of net pairs included in the set P.

When a net n and coordinates xL(p) and xR(p) are given similarly to the second embodiment, division step S505 is executed including substeps S5051 through S5056.

In substep S5051, variable c is set to 1, and variable cc is set to 0.

In substep S5052, it is checked whether or not dogleg introduction is possible for the net n at the column xL(p)+c. In this substep, dogleg introduction is not possible, for example, if both the boundaries have terminals of other nets at the column xL(p)+c. If dogleg introduction at the column is possible, the trunk of the net n is divided at the column xL(p)+c, and variable cc is set to 0.

In substep S5053, if variable cc is 0, then the process proceeds to substep S5055. If not, it is examined whether or not the dogleg introduction is possible for the net n' at the column xL(p)+c. If possible, the trunk of net n' is divided at the column xL(p)+c, and variable cc is set to 0.

In substep S5054, if variable cc is $\gamma$, then the trunk of one of the net n and net n' is divided at the column xL(p)+c, and variable cc is set to 0.

In substep S5055, variable c is set to (c+1), and variable cc is set to (cc+1).

Further, in substep S5056, if xL(p)+c is xR(p), then the process proceeds to step S506. If not, the process returns to substep S5052.

Step S506 involves introduction of additional constraints, in which a net pair included in set P and having trunks running parallel to each other in a length equal to or larger than $\gamma$ must not be assigned to tracks having therebetween a spacing equal to or less than $\beta$, in addition to the existing vertical constraints R obtained in step S501. New vertical constraints as obtained above are now called vertical constraints R which are used in next step S507.

Final step S507 involves track assignment based on the vertical constraints R.

For the given interconnection routing in the channel area as shown in FIG. 1A, if $\beta=3$ and $\gamma=6$, it is impossible to obtain final interconnection routing in which number of tracks in the channel area is limited to four, by the conventional method including the steps of increasing the spacing between nets by means of a compactor and permutating the tracks for the interconnections.

Figure 9:
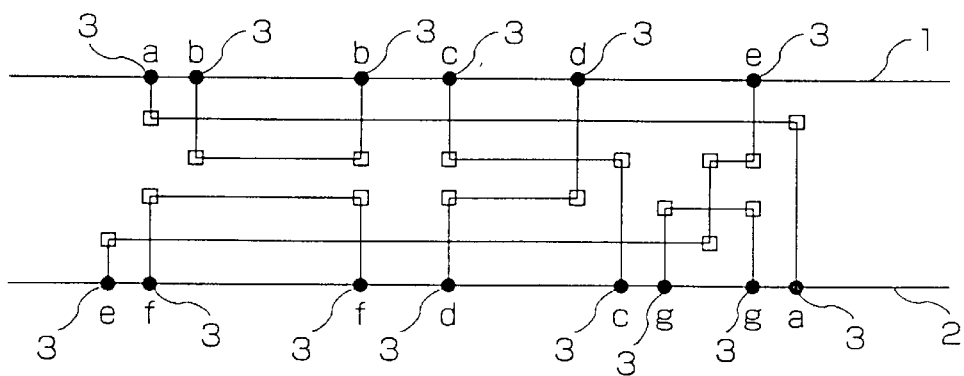
FIG. 9 is a diagram of an interconnection routing in a channel area obtained by an interconnection routing method according to the third embodiment of the present invention.

The present embodiment is applied to the channel area of FIG. 1A. Referring to FIG. 9 showing the resultant final interconnection routing, the track number used here is as low as four. Further, the length of a channel portion is only one in which net a and net e run parallel to each other with the spacing therebetween being equal to or less than $\beta$, and thereby electric interaction, such as crosstalk will not be induced.

Figure 10:
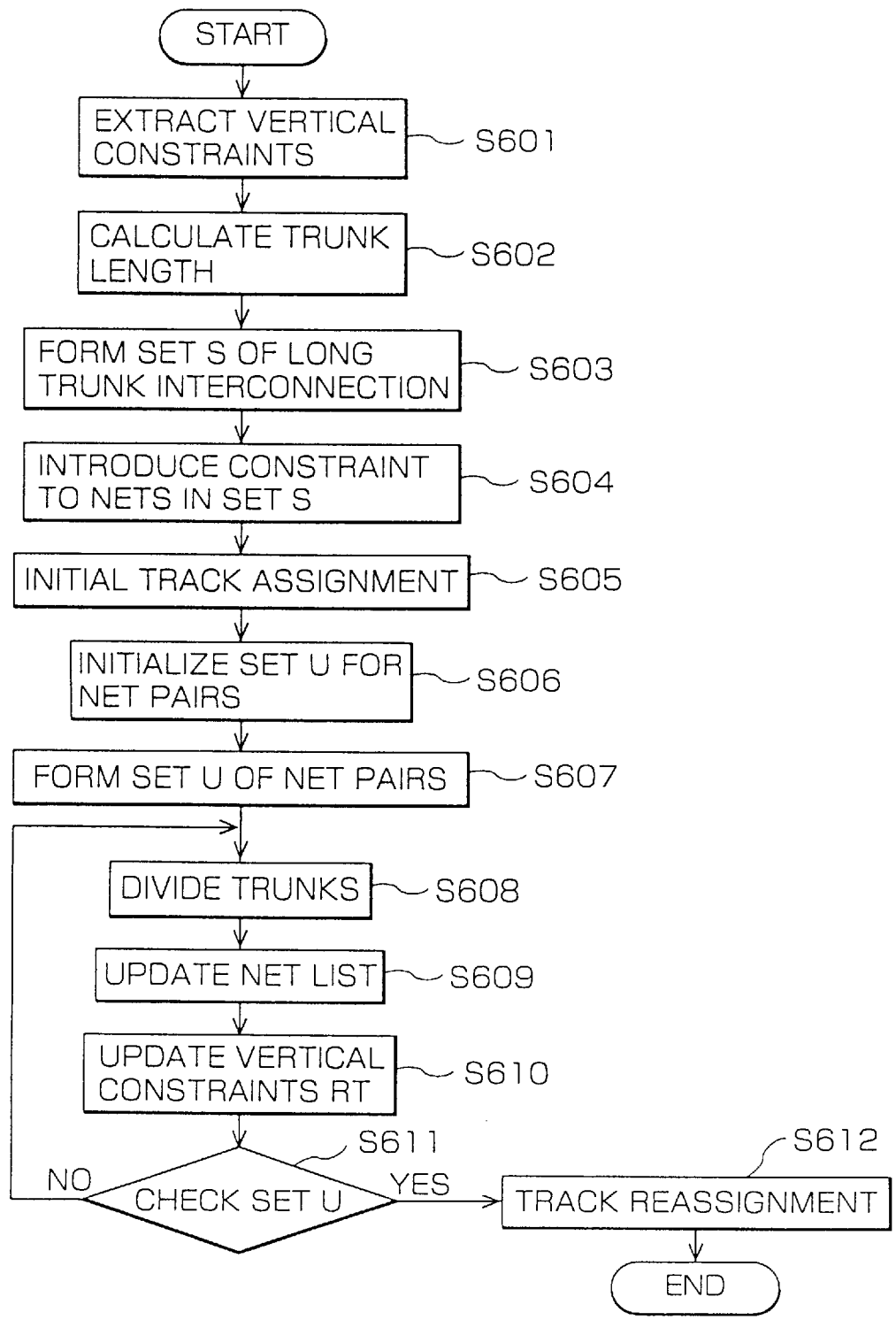
FIG. 10 is a flowchart showing a process for an interconnection routing method according to the fourth embodiment of the present invention.

FIG. 10 shows a process flow of an interconnection routing method in an integrated circuit according to a fourth embodiment of the present invention.

The interconnection routing method according to the present embodiment includes twelve steps S601 through S612. By those steps, if the constraint to assign a net having a long trunk extending almost an entire channel area to a track in a central portion of the channel area conflicts with the original vertical constraint, introduction of dogleg (jog introduction) is performed to overcome the generated conflict.

The first step S601 involves extraction of vertical constraints R from a net list NL and terminal positions of each of the nets at the boundaries of the channel area. Second step S602 involves obtaining the length of the trunk of each net in the net list NL. Third step S603 involves forming a set S for the nets each having a trunk length LT longer than or equal to a threshold $\alpha$.

Fourth step S604 involves provision of new constraints T for nets n in the set S in which each of the nets included in the set S must be assigned first to tracks in a central portion of the channel area. The original vertical constraints R as obtained in step S601 and the constraints T make new vertical constraints RT.

Next step S605 involves an initial track assignment in which each of the nets included in the net list is assigned to a track based on the vertical constraints RT to obtain a virual routing. Subsequent step S606 involves initializing a set U for net pairs to null or empty. Next step S607 involves entry of each of the net pairs (n,n') in the virtual routing satisfying the condition A as defined below into the set U, the net pairs (n,n') being included in the set S.

The condition A is such that there is a cycle including both a node corresponding to net n and a node corresponding to net n', in a vertical constraint graph formed based on the vertical constraints RT.

Next step S608 involves division of trunk in which each of the trunks of the net pairs p=(n,n') included in the set P is divided based on the first and second conditions as detailed below.

The first condition is such that the cycle including the nets n and n' in the vertical constraint graph is cancelled or deleted by the division.

The second condition is such that the trunks assigned to tracks located in a central portion of the channel area have maximum length among the trunks of each of the nets n and nets n'.

Next step S609 involves updating net list in which the nets n and n' are deleted from the net list NL and in which the divided pieces of the trunks obtained in step S608 are listed in the net list NL as new nets. Step S610 involves updating the vertical constraints RT in accordance with the result of updating the net list. The net pair (n,n') is deleted from the set U.

Next step S611 involves examination of the set U whether or not the set U is empty. If the set U is empty, then the process proceeds to step S612. If not, the process returns to step S608.

Final step S612 involves reassigning tracks in which track assignment is carried out based on the vertical constraints RT.

Figure 11A:
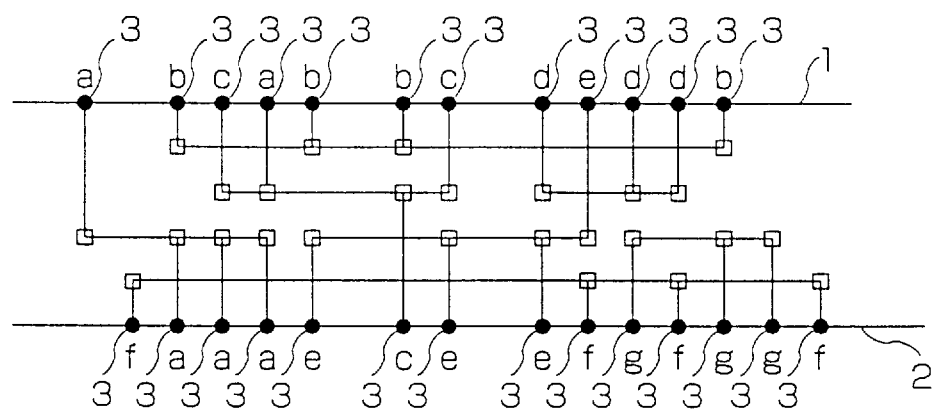
FIG. 11A is a diagram of an interconnection routing obtained without consideration of number of crossings in a channel area.
Figure 11B:
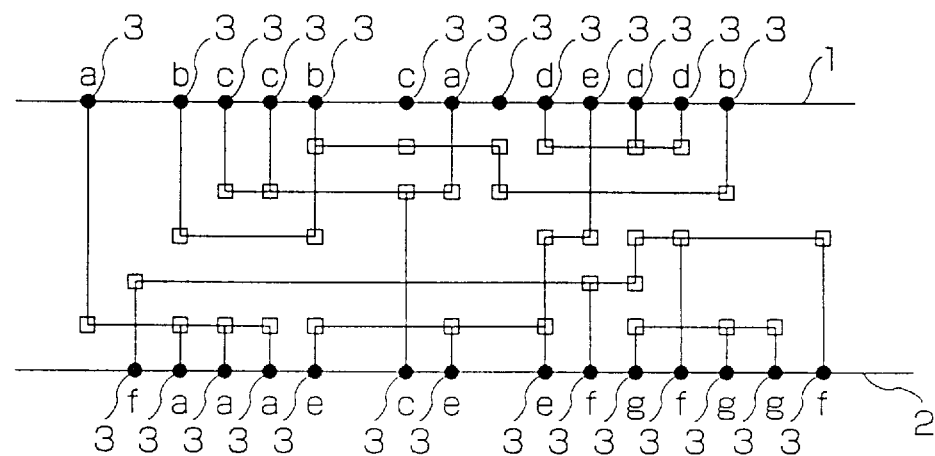
FIG. 11B is a diagram of an interconnection routing obtained by the interconnection routing method according to the fourth embodiment of the present invention.

Next, a channel area as shown in FIGS. 11A and 11B will be discussed.

If constraints are introduced by which net b and net f must be assigned to a central portion of the channel area, a cycle is involved in the vertical constraint graph. Accordingly, it is impossible to apply track permutation for a given interconnection routing by using a conventional interconnection routing method.

FIG. 11A shows the result obtained in step S605 of the initial track assignment according to the present invention.

At this stage, net b crosses other nets at seven points and the number of the crossing of the net f is ten. FIG. 11B the result after the interconnection method according to the fourth embodiment of the present invention is applied to the interconnection routing shown in FIG. 11A.

In FIG. 11B, the numbers of the crossings of the nets b and f are two, and therefore, reduced down to 29% and 20% of the original crossings, respectively.

As described above, in the preferred embodiments of the present invention, track assignment includes assigning a long trunk to a track in a central portion of a channel area, in addition to vertical constraint rule, for a target net n. As a result, it is possible to limit a number of interconnections that cross the net n. If there are a plurality of nets each having a long trunk, there may be a case in which all of the nets cannot be assigned to tracks in the central portion. In this case, the trunk is divided at a constant pitch. Further, the trunk is divided at a position where bending process can be applied with ease in order to avoid the vertical constraint. Furthermore, it is also possible to limit the length of interconnections running parallel and adjacent to each other by introducing constraints to the divided trunks so that they are not assigned to the same track.

In those ways as described above, if an interconnection routing is given to a channel area, the present invention can limit crosstalk generation and reduce coupled capacitance.

Since above embodiments are described only for examples, the present invention is not limited to such embodiments and it will be obvious for those skilled in the art that various modifications or alterations can be easily made based on the above embodiments within the scope of the present invention.

What is claimed is:

1. An interconnection routing method for obtaining an interconnection routing in a channel area of an integrated circuit including the steps of:

forming a first set of nets each included in a given net list and having a trunk length larger than a first target length; and assigning each of the nets included in the first set to a central track located in a central portion of the channel area; and assigning each of the nets in the given net list not included in the first set to a peripheral track located in a peripheral portion of the channel area.

2. An interconnection routing method as defined in claim 1, the step of assigning included nets further including the steps of:

assigning each given net in said first set to a track in a channel area to obtain a virtual routing;

forming a set of net pairs, said net pairs being pairs of nets included in the first set, said net pairs each having trunks running parallel at a constant pitch in a length equal to or larger than a second target length, with a space therebetween being smaller than a target distance, in the virtual routing;

dividing the trunk of at least one net of each net pair into at least two subnets; and replacing each of the at least one nets in the given net list with the subnets and removing each of said at least one nets from said first set.

3. An interconnection routing method as defined in claim 2, wherein the constant pitch is equal to the second target length.

4. An interconnection routing method as defined in claim 2 wherein said assigning of each of the nets not included in said first set is executed based on a vertical constraint.

5. An interconnection routing method for obtaining an interconnection routing in a channel area of an integrated circuit including the steps of:

assigning each net in a given net list to a track in a channel area to obtain a virtual routing;

forming a set of net pairs, said net pairs being pairs of nets in said given net list each having trunks running parallel at a constant pitch in a length larger than a target length, with a space therebetween being smaller than a target distance, in the virtual routing;

dividing the trunk of at least one net of each net pair into at least two subnets;

replacing each at least one net in the given net list with the subnets to form a first net list; and assigning each net in the first net list to a track in the channel area.

6. An interconnection routing method as defined in claim 5 wherein said each net is assigned based on a vertical constraint.

7. An interconnection routing method for obtaining an interconnection routing in a channel area of an integrated circuit including the steps of:

assigning each net in a given net list to a track in a channel area to obtain a virtual routing;

forming a net pair set of pairs of nets in said given net list each having trunks running parallel to each other in a length larger than a target length, with a space therebetween being smaller than a target distance, in the virtual routing;

forming a jog in the trunk of at least one net of each net pair of the set such that the length of the trunks running parallel to each other, with a space therebetween being smaller than said target distance is less than said target length, whereby a dogleg net is formed from the at least one net;

replacing the at least one net with the dogleg net to form a routing net list; and assigning each net in the routing net list to a track.

8. An interconnection routing method as defined in claim 7 wherein said assigning of each net in the routing net list including the steps of:

forming a set of nets each included in the routing net list and having a trunk length larger than a first target length;

assigning each of the nets in the set of nets to a central track located in a central portion of the channel area; and assigning each of the nets not included in the set of nets to a peripheral track located in a peripheral portion of the channel area.

9. An interconnection routing method as defined in claim 8 wherein said assigning of each net not included in the set of nets is executed based on a vertical constraint.

10. An interconnection routing method as defined in claim 7 wherein said forming of the jog is not executed at a specified position corresponding to the position of terminals of other nets.

* * * * *